US012571983B2

(12) United States Patent
Dirauf et al.

(10) Patent No.: US 12,571,983 B2
(45) Date of Patent: Mar. 10, 2026

(54) OPTICAL SYSTEM, AND METHOD FOR OPERATING AN OPTICAL SYSTEM

(71) Applicant: Carl Zeiss SMT GmbH, Oberkochen (DE)

(72) Inventors: Andre Dirauf, Aalen (DE); Toralf Gruner, Aalen (DE); Norman Baer, Aalen (DE); Thomas Monz, Schlierbach (DE); Paul Buettner, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 458 days.

(21) Appl. No.: 18/328,154

(22) Filed: Jun. 2, 2023

(65) Prior Publication Data

US 2023/0324648 A1      Oct. 12, 2023

Related U.S. Application Data

(63) Continuation of application No. PCT/EP2021/083360, filed on Nov. 29, 2021.

(30) Foreign Application Priority Data

Jan. 28, 2021   (DE) ......................... 102021200788.0
Jul. 16, 2021   (DE) ......................... 102021207580.0

(51) Int. Cl.
*G02B 5/08*        (2006.01)
*G02B 7/18*        (2021.01)
*G03F 7/00*        (2006.01)

(52) U.S. Cl.
CPC .......... *G02B 7/1815* (2013.01); *G03F 7/702* (2013.01); *G03F 7/70233* (2013.01); *G03F 7/70316* (2013.01)

(58) Field of Classification Search
CPC ... G02B 7/1815; G03F 7/702; G03F 7/70233; G03F 7/70316; G03F 7/705; G03F 7/70891; G03F 7/70266
See application file for complete search history.

(56) References Cited

U.S. PATENT DOCUMENTS 9,207,541 B2    12/2015   Hauf et al.
10,161,808 B2    12/2018   Vogt et al.
(Continued)

FOREIGN PATENT DOCUMENTS

DE     10 2011 081 259 A1     3/2012
DE     10 2010 061 950 A1     5/2012
(Continued)

OTHER PUBLICATIONS

GPTO-Office Action, with translation thereof, for corresponding DE Appl No. 10 2021 200 788.0, dated Jul. 6, 2021.
(Continued)

*Primary Examiner* — Euncha P Cherry
(74) *Attorney, Agent, or Firm* — Fish & Richardson P.C.

(57)                ABSTRACT

An optical system, for example in a microlithographic projection exposure apparatus, comprises a mirror and a temperature-regulating device. The mirror has an optical effective surface and a mirror substrate. A plurality of temperature-regulating zones are arranged in the mirror substrate. The temperature-regulating device is used to adjust the temperatures present in each of the temperature-regulating zones independently of one another. The temperature-regulating zones are arranged in at least two planes at different distances from the optical effective surface. The temperature-regulating zones in the at least two planes are configured as cooling channels through which, independently of one another, a cooling fluid at a variably adjustable
(Continued)

cooling fluid temperature is able to flow. A method for operating such an optical system is provided.

20 Claims, 7 Drawing Sheets

(56)                    References Cited

U.S. PATENT DOCUMENTS

| | | |
|---|---|---|
| 2006/0028627 A1 | 2/2006 | Box |
| 2010/0200777 A1 | 8/2010 | Hauf |
| 2014/0071523 A1 | 3/2014 | Hartjes et al. |
| 2014/0340659 A1* | 11/2014 | Van Schoot ........ G03F 7/70858 |
| | | 355/30 |
| 2020/0094478 A1* | 3/2020 | Zediker .................. B33Y 30/00 |

FOREIGN PATENT DOCUMENTS

| | | |
|---|---|---|
| DE | 10 2011 005 778 A1 | 9/2012 |
| DE | 10 2013 201 805 A1 | 11/2013 |
| DE | 10 2014 212 691 A1 | 8/2014 |
| DE | 10 2015 224 281 A1 | 9/2016 |
| DE | 102018208783 A1 | 7/2018 |
| DE | 10 2020 204 722 A1 | 11/2020 |
| DE | 10 2020 207 099 A1 | 3/2021 |
| DE | 10 2020 214 130 A1 | 8/2021 |
| DE | 10 2021 200 790 A1 | 7/2022 |
| KR | 2015-0122722 A | 11/2015 |
| WO | WO 2011/116792 A1 | 9/2011 |
| WO | WO 2012/041744 A1 | 4/2012 |
| WO | WO 2014/131889 A1 | 9/2014 |
| WO | WO 2016/142185 A1 | 9/2016 |
| WO | WO 2019/206637 A1 | 10/2019 |
| WO | WO 2022/028710 A1 | 2/2022 |
| WO | WO 2022/161658 A1 | 8/2022 |

OTHER PUBLICATIONS

Translation of the International Search Report for corresponding PCT Appl No. PCT/EP2021/083360, dated Mar. 25, 2022.
Translation of the International Report on Patentability for corresponding PCT Appl No. PCT/EP2021/083360, dated Aug. 10, 2022.
Office Action in Korean Appln. No. 10-2023-7022932, mailed on Nov. 11, 2025, 23 pages (with English translation).

* cited by examiner

OPTICAL SYSTEM, AND METHOD FOR OPERATING AN OPTICAL SYSTEM

CROSS-REFERENCE TO RELATED APPLICATIONS

The present application is a continuation of, and claims benefit under 35 USC 120 to, international application PCT/EP2021/083360, filed Nov. 29, 2021, which claims benefit under 35 USC 119 of German patent application DE 10 2021 200 788.0, filed on Jan. 28, 2021, and the German patent application DE 10 2021 207 580.0, filed on Jul. 16, 2021. The entire disclosure of these applications are incorporated by reference herein.

FIELD

The disclosure relates to an optical system and to a method for operating an optical system, for example in a microlithographic projection exposure apparatus.

BACKGROUND

Microlithography is used for producing microstructured components, such as for example integrated circuits or LCDs. The microlithography process is carried out in what is referred to as a projection exposure apparatus, which comprises an illumination device and a projection lens. The image of a mask (=reticle) illuminated via the illumination device is projected here via the projection lens onto a substrate (e.g. a silicon wafer) coated with a light-sensitive layer (photoresist) and arranged in the image plane of the projection lens, in order to transfer the mask structure to the light-sensitive coating of the substrate.

In projection lenses designed for the EUV range, i.e. at wavelengths of e.g. approximately 13 nm or approximately 7 nm, mirrors are typically used as optical components for the imaging process owing to the general lack of availability of suitable light-transmissive refractive materials.

As a result of absorption of the radiation emitted by the EUV light source among other reasons, the EUV mirrors can heat up and can undergo an associated thermal expansion or deformation, which in turn can adversely affect the imaging properties of the optical system.

Various approaches are known for avoiding surface deformations caused by heat inputs into an EUV mirror and optical aberrations associated therewith. It is known inter alia to use a material with ultra-low thermal expansion ("Ultra Low Expansion Material"), for example a titanium quartz glass sold by Corning Inc. with the name ULE™, as the mirror substrate material and to set what is known as the zero-crossing temperature in an area near the optically effective surface. At this zero-crossing temperature, which lies at around 9=30° C. for example for ULE™, the coefficient of thermal expansion has in its temperature dependence a zero crossing in the vicinity of which no thermal expansion or only negligible thermal expansion of the mirror substrate material takes place.

Other possible approaches for addressing surface deformations caused by heat inputs into an EUV mirror include active direct cooling or the use of a heating arrangement, for example on the basis of infrared radiation. With such a heating arrangement, active mirror heating can take place in phases of comparatively low absorption of EUV used radiation, the active mirror heating being correspondingly decreased as the absorption of the EUV used radiation increases. In this respect, the current heating state of the EUV mirror is typically ascertained using one or more temperature sensors attached to the EUV mirror. The active heating of the mirror can be carried out for example with the aim of keeping the average mirror temperature close to the abovementioned zero-crossing temperature.

In this respect, however, other issues can occur in practice, among other things owing to the spatial distribution of the zero-crossing temperature in the mirror substrate material and owing to undesired heat inputs into the optical system by the heating arrangement used. Furthermore, the temperature measured at the location of the respective temperature sensor generally deviates from the ultimately relevant temperature (for example the temperature at the optically effective surface of the EUV mirror or the average mirror temperature), with the result that regulation of the heating power on this basis ultimately can bring about only insufficient avoidance of thermally induced surface deformations or optical aberrations.

SUMMARY

The present disclosure seeks to provide an optical system and a method for operating an optical system which make it possible to effectively avoid thermally induced deformations whilst at least alleviating the issues described above.

According to one aspect of the disclosure, an optical system comprises:

at least one mirror having an optically effective surface and a mirror substrate, wherein a plurality of temperature control zones are arranged in the mirror substrate; and a temperature control device, via which the temperatures respectively present in the temperature control zones can be set independently of one another;

wherein the temperature control zones are arranged in at least two planes at different distances from the optically effective surface; and wherein the temperature control zones in these at least two planes are in the form of cooling channels, through which, independently of one another, a cooling fluid with a variably settable cooling-fluid temperature can flow.

The disclosure involves the concept of producing an adaptive mirror with a selectively deformable optically effective surface by providing temperature control zones that are at different distances from the optically effective surface and can be set independently of one another in terms of their temperature, wherein the fact that different thermal expansions in the different planes of the temperature control zones are ultimately converted into a surface deformation of the mirror is utilized, in a similar way to what is referred to as the "bimetal effect".

In other words, the disclosure involves actively creating a surface deformation of the relevant mirror in the course of setting, in a selectively spatially resolved manner, temperature differences in at least two different planes which differ from one another in terms of their distance from the optically effective surface, and in this respect also provides an additional degree of freedom when setting the wavefront properties of the optical system comprising this mirror.

By virtue of the fact that then the temperature of different temperature control zones can be set in a spatially variable manner, or independently of one another for the individual temperature control zones, not only in the different planes but also respectively within one and the same plane, it is possible for the aforementioned degree of freedom to be realized for example also in the form of a local degree of freedom (which can be useful when setting the wavefront properties of the optical system). To that end, a suitable selection of the respective temperatures in the temperature control zones assigned to different planes makes it possible to approximately have the effect that an effective surface deformation takes place ultimately only at one lateral position on the optically effective surface owing to a local mechanical stress, whereas no such deformation occurs in the rest of the regions of the optically effective surface.

Overall, this approach can make it possible to realize relatively precise setting of a deformation profile in an adaptive mirror, it also being possible to correct disturbances, which have a comparatively high frequency in local terms, in the optical properties of the relevant mirror or of the optical system comprising this mirror. For example, such disturbances with low spatial wavelengths (e.g. of the order of magnitude of 1 mm) can be disturbances owing to a spatial distribution of the zero-crossing temperature in the mirror substrate material.

According to one embodiment, the optical system also comprises a regulating unit for temporally variable regulation of the temperatures respectively set in the temperature control zones by the temperature control device.

According to one embodiment, the optical system also comprises a device for ascertaining the cooling power that is output when cooling fluid flows through the cooling channels.

According to one embodiment, a determination, underlying the regulation, of the respectively current heating state of the mirror is carried out on the basis of the cooling power that is output by the cooling fluid when it flows through the cooling channels.

In this case, involves the further consideration that the power output of the cooling fluid flowing in the cooling channels, given a known flow rate and a known heat transfer coefficient in the region of the respective cooling channel wall, ultimately constitutes a measure for the temperature gradients that are present in the mirror substrate material on average and thus for the current heating state of the mirror.

For the cooling power that is output by the cooling fluid when it flows through the cooling channels $P_{Kühl}$, it holds true that:

$$P_{cool} = \alpha \cdot A \cdot \Delta T \quad (1)$$

wherein a denotes the heat transfer coefficient in the region of the respective cooling channel wall, A denotes the contact surface of the mirror substrate in relation to the mirror substrate material, and $\Delta T$ denotes the temperature difference between the mirror substrate material and the cooling fluid. The temperature difference between the inlet and the outlet of the relevant cooling channel is produced by integration over the local cooling powers along the cooling section and division by the heat capacity C of the cooling fluid to give $$T_{inlet} - T_{outlet} \approx -\int dl P_{cool}(l)/(C \cdot L) \quad (2)$$

wherein l denotes the position along the cooling section and L denotes the overall length of the cooling section. The flow velocity can be used to determine a mass flow per unit time, and from this, using the specific heat capacity of the cooling fluid, it is possible to determine the value of C. Correspondingly, it is possible to determine an average temperature difference $\Delta T$ between the mirror substrate material and the cooling fluid, from which in turn an estimation of the temperature distribution in the mirror substrate material can be obtained.

On the basis of the cooling power that is output by the cooling fluid when it passes through the cooling channels, it is possible to ascertain the temperature field present in the mirror substrate material with relatively high accuracy, such that it is also possible for a regulation, based on this temperature information, of the temperatures respectively set by the temperature control device to be carried out with greater precision (for instance, in comparison with a conventional determination of the heating state of the mirror on the basis of temperature sensors or wavefront sensors in the optical system that are located on the rear side of the mirror). In this respect, the determination according to the disclosure, based on the power output of the cooling fluid, of the heating state of the mirror is desirable for example when the mirror substrate material exhibits a nonlinear profile of the temperature dependence of the deformation, because then absolute knowledge of the respectively current mirror temperature is also relevant.

The above described concept of the ascertainment of the current heating state of the mirror on the basis of the cooling power that is output by the cooling fluid when it flows through the cooling channels is also desirable independently of the abovedescribed principle of the arrangement of temperature control zones in different planes within the mirror substrate.

The disclosure thus furthermore also relates to an optical system comprising:

at least one mirror having an optically effective surface and a mirror substrate, wherein a plurality of temperature control zones are arranged in the mirror substrate, wherein the temperature control zones are in the form of cooling channels, through which, independently of one another, a cooling fluid with a variable cooling-fluid temperature can flow;

a device for ascertaining the cooling power that is output when the cooling fluid flows through the cooling channels; and a regulating unit for temporally variable regulation of the temperatures respectively set in the temperature control zones by the temperature control device, wherein a determination, underlying this regulation, of the respectively current heating state of the mirror is carried out on the basis of the ascertained cooling power that is output when the cooling fluid flows through the cooling channels.

According to one embodiment, the mirror substrate has a first mirror substrate part made of a first mirror substrate material and at least one second mirror substrate part, which is arranged on that side of the first mirror substrate part that faces away from the optically effective surface and which is made from a second mirror substrate material which differs from the first mirror substrate material.

According to one embodiment, the two planes of the temperature control zones are assigned to different mirror substrate parts.

According to one embodiment, the first mirror substrate material has a lower average coefficient of thermal expansion than the second mirror substrate material.

In the above described configuration, the disclosure can make use of the fact that, for the temperature control zones that are at a comparatively greater depth in the mirror substrate in relation to the optically effective surface, greater thermal expansion than for the temperature control zones that are closer to the optically effective surface is absolutely desirable in order to achieve a possibly significant effect in terms of the desired deformation of the optically effective surface, in a similar way to what is referred to as the bimetal effect. In addition, this configuration makes it possible to partially manufacture the mirror substrate from a material (e.g. quartz glass, $SiO_2$) which is relatively inexpensive (for instance compared to ULE™).

According to one embodiment, a respective plurality of temperature control zones are arranged in at least one of the two planes, wherein the temperatures for the temperature control zones located in the respective plane can be set independently of one another.

According to one embodiment, the temperature control device has a plurality of Peltier elements assigned to the respective temperature control zones.

According to one embodiment, the temperature control device has a plurality of radiant heaters assigned to the respective temperature control zones.

According to one embodiment, the mirror is designed for an operating wavelength of less than 30 nm, for example less than 15 nm.

According to one embodiment, the optical system is a projection lens or an illumination device of a microlithographic projection exposure apparatus.

The disclosure furthermore also relates to a method for operating an optical system, wherein the optical system comprises at least one mirror having an optically effective surface and a mirror substrate, wherein a plurality of temperature zones are arranged in the mirror substrate in at least two planes at different distances from the optically effective surface, wherein the temperatures respectively present in the temperature control zones are set independently of one another.

In this respect, according to one aspect, the setting of the temperature in the temperature control zones is carried out in such a way that a deformation, caused by the different thermal expansion of temperature control zones belonging to different planes, of the optically effective surface corresponds to a desired deformation.

According to a further aspect, the setting of the temperature in the temperature control zones is carried out in such a way that a thermally induced deformation, associated with the application of electromagnetic radiation to the optically effective surface, of the mirror is at least partially compensated by the thermal expansion of the temperature control zones.

According to one embodiment, the temperatures respectively set in the temperature control zones by the temperature control device are regulated in a temporally variable manner.

According to one embodiment, the temperature control zones are in the form of cooling channels, through which, independently of one another, a cooling fluid with a variably settable cooling-fluid temperature can flow.

According to one embodiment, a determination, underlying the regulation, of the respectively current heating state of the mirror is carried out on the basis of the cooling power that is output when the cooling fluid flows through the cooling channels.

The disclosure furthermore also relates to a method for operating an optical system, wherein the optical system comprises at least one mirror having an optically effective surface and a mirror substrate, wherein a plurality of temperature control zones, which are in the form of cooling channels through which, independently of one another, a cooling fluid with a variably settable cooling-fluid temperature can flow, are arranged in the mirror substrate, wherein the temperature respectively set in the temperature control zones is regulated in a temporally variable manner, and wherein a determination, underlying this regulation, of the respectively current heating state of the mirror is carried out on the basis of an ascertainment of the cooling power that is output when the cooling fluid flows through the cooling channels.

Further configurations of the disclosure are evident from the description and the dependent claims.

The disclosure is explained in greater detail below on the basis of exemplary embodiments illustrated in the accompanying figures.

DETAILED DESCRIPTION

Figure 7:
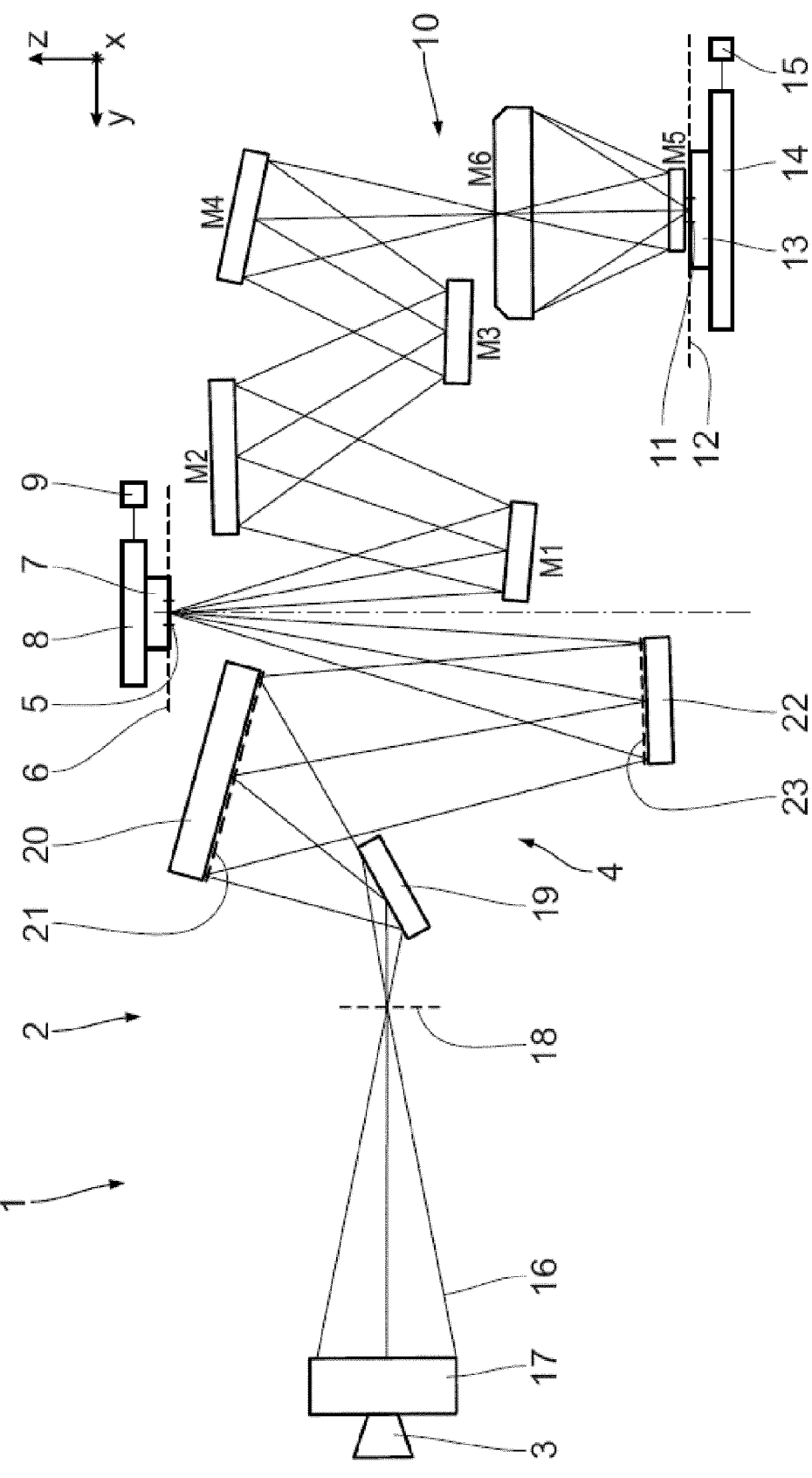
FIG. 7 shows a schematic illustration of the possible structure of a microlithographic projection exposure apparatus designed for operation in the EUV.

FIG. 7 first of all schematically shows a meridional section through the possible structure of a microlithographic projection exposure apparatus designed for operation in the EUV.

According to FIG. 7, the projection exposure apparatus 1 comprises an illumination device 2 and a projection lens 10. One embodiment of the illumination device 2 of the projection exposure apparatus 1 has, in addition to a light or radiation source 3, an illumination optical unit 4 for illuminating an object field 5 in an object plane 6. In an alternative embodiment, the light source 3 may also be provided as a module separate from the rest of the illumination device. In this case, the illumination device does not comprise the light source 3.

Here, a reticle 7 arranged in the object field 5 is exposed. The reticle 7 is held by a reticle holder 8. The reticle holder 8 is displaceable, for example in a scanning direction, by way of a reticle displacement drive 9. For purposes of elucidation, a Cartesian xyz coordinate system is shown in FIG. 7. The x direction runs perpendicularly to the plane of the drawing. The y direction runs horizontally, and the z direction runs vertically. The scanning direction runs along the y direction in FIG. 7. The z direction runs perpendicularly to the object plane 6.

The projection lens 10 serves for imaging the object field 5 into an image field 11 in an image plane 12. A structure on the reticle 7 is imaged onto a light-sensitive layer of a wafer 13 arranged in the region of the image field 11 in the image plane 12. The wafer 13 is held by a wafer holder 14. The wafer holder 14 is displaceable, for example along the y direction, by way of a wafer displacement drive 15. The displacement on the one hand of the reticle 7 by way of the reticle displacement drive 9 and on the other hand of the wafer 13 by way of the wafer displacement drive 15 may take place in such a way as to be synchronized with one another.

The radiation source 3 is an EUV radiation source. The radiation source 3 for example emits EUV radiation, which is also referred to below as used radiation or illumination radiation. For example, the used radiation has a wavelength in the range between 5 nm and 30 nm. The radiation source 3 can be for example a plasma source, a synchrotron-based radiation source or a free electron laser (FEL). The illumination radiation 16 emanating from the radiation source 3 is focussed by a collector 17 and propagates through an intermediate focus in an intermediate focal plane 18 into the illumination optical unit 4. The illumination optical unit 4 comprises a deflection mirror 19 and, arranged downstream thereof in the beam path, a first facet mirror 20 (having schematically indicated facets 21) and a second facet mirror 22 (having schematically indicated facets 23).

The projection lens 10 comprises a plurality of mirrors Mi (i=1, 2, . . . ), which are consecutively numbered according to their arrangement in the beam path of the projection exposure apparatus 1. In the example illustrated in FIG. 7, the projection lens 10 comprises six mirrors M1 to M6. Alternatives with four, eight, ten, twelve or any other number of mirrors M1 are similarly possible. The penultimate mirror M5 and the last mirror M6 each have a through opening for the illumination radiation 16. The projection lens 10 is a doubly obscured optical unit. The projection lens 10 has an image-side numerical aperture that is greater than 0.5 and may also be greater than 0.6, and may be for example 0.7 or 0.75.

During operation of the microlithographic projection exposure apparatus 1, the electromagnetic radiation incident on the optically effective surface of the mirrors is partially absorbed and, as explained in the introduction, results in heating and an associated thermal expansion or deformation, which in turn can result in an impairment of the imaging properties of the optical system. The concept according to the disclosure can be applied to any desired mirror of the microlithographic projection exposure apparatus 1 from FIG. 7. This can be effected to avoid or compensate thermally induced deformations of the relevant mirror itself (for example to compensate a spatial distribution of the zero-crossing temperature) or else to provide an additional degree of freedom in terms of setting the wavefront properties of the entire optical system, that is to say without or with a corrective action achieved by the relevant mirror.

The disclosure is not restricted to use in a projection exposure apparatus designed for operation in the EUV. For example, the disclosure can also be used in a projection exposure apparatus designed for operation in the DUV (i.e. at wavelengths less than 250 nm, for example less than 200 nm) or also in another optical system.

Figure 1:
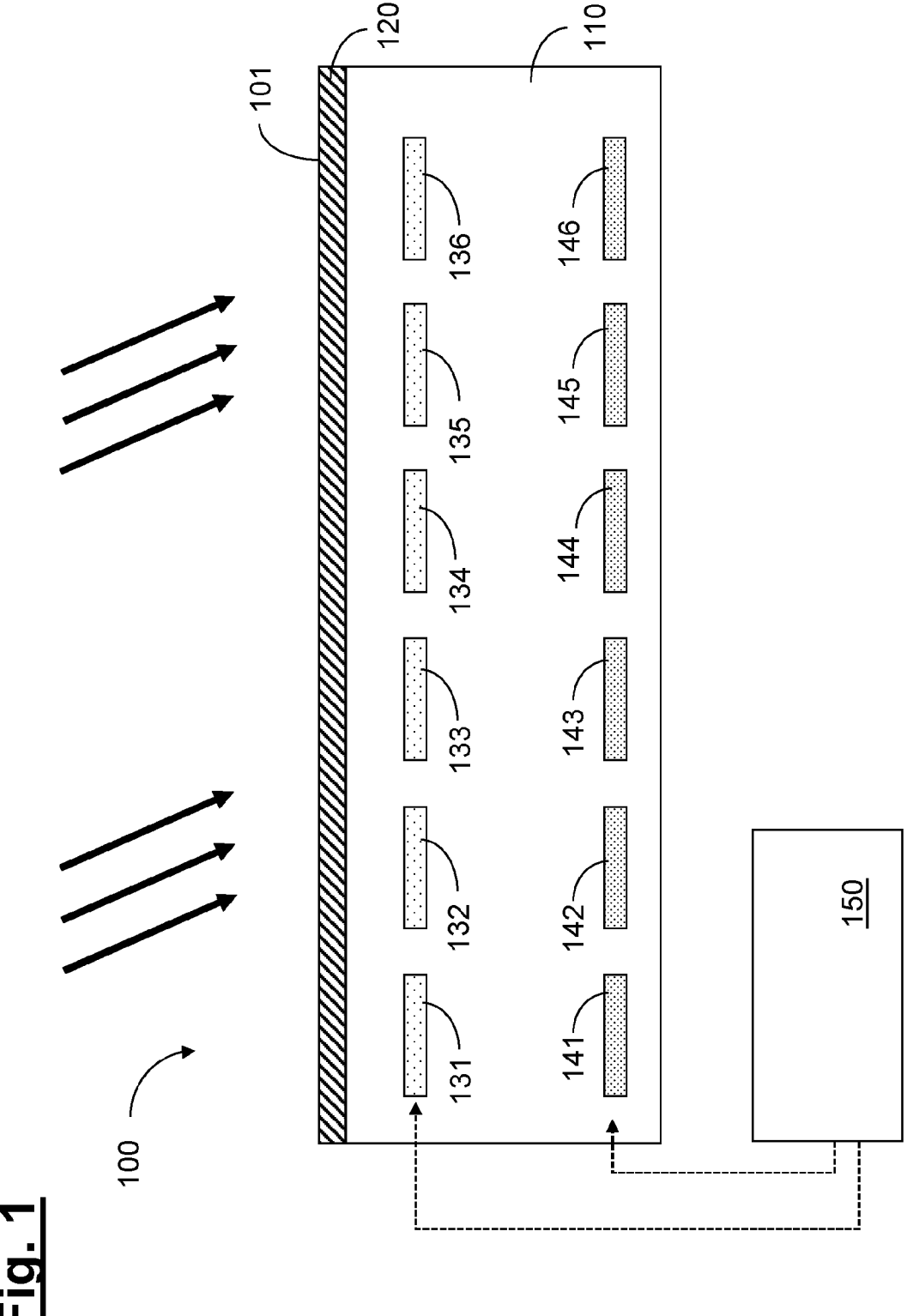
FIG. 1 shows a schematic illustration for elucidating the possible structure of a mirror according to one embodiment of the disclosure.

FIG. 1 shows a merely schematic illustration of one possible embodiment of a mirror 100 according to the disclosure. The mirror 100 has a mirror substrate 110 (e.g. made of ULE™) and a reflection layer system 120 (e.g. in the form of a molybdenum (Mo)-silicon (Si) multilayer coating stack). Within the mirror substrate 110 there are a plurality of temperature control zones 131-136 and 141-146, which are arranged in two planes at different distances from the optically effective surface 101. In the specific exemplary embodiment, the temperature control zones 131-136 and 141-146 are in the form of cooling channels, through which, independently of one another, a cooling fluid with a variably settable cooling-fluid temperature can flow.

"150" denotes a temperature control device, via which the temperatures respectively present in the temperature control zones 131-136, 141-146 can be set independently of one another. Merely by way of example, the temperature control device 150 may have a plurality of Peltier elements assigned to the respective temperature control zones.

Although the disclosure in the exemplary embodiment of FIG. 1 is realized by respective cooling channels through which cooling fluid can flow, the disclosure is not restricted to this. Rather, in other embodiments, the targeted selective setting of different temperatures in different temperature control zones can also be carried out in another suitable way, e.g. via radiant heaters with different focal depths or resistance heating elements.

The setting of different temperatures in the region of the temperature control zones, 131-136 on the one hand and 141-146 on the other hand, that are located at a first different distance from the optically effective surface 101 results in a deformation of the optically effective surface 101 owing to the different thermal expansion of the mirror substrate material in the relevant planes, in a similar way to what is referred to as the bimetal effect. This can in turn be used to provide an additional degree of freedom in terms of setting the wavefront properties of the optical system (e.g. the projection exposure apparatus 1 from FIG. 7) comprising the mirror 100.

The temperature setting according to the disclosure in the temperature control zones can be carried out for the one part in order to set a desired deformation of the optically effective surface 101 (e.g. in order to compensate a disturbance or aberration present elsewhere in the optical system). As an alternative, the temperature setting can also be carried out in order to compensate thermally induced deformations in the mirror 100 itself. In the latter case, it is therefore possible for example for the temperature control zones 141-146 to be used to avoid bulging or deformation, otherwise associated with (cooling) operation of the temperature control zones 131-136, of the mirror 100. In the case of this approach, therefore, the temperature control zones 131-136 serve to discharge the heat generated by absorption of the electromagnetic radiation incident on the optically effective surface 101, and the temperature control zones 141-146 serve to compensate a deformation caused in other respects by the temperature control zones 131-136 through which cooling fluid flows.

Figure 2:
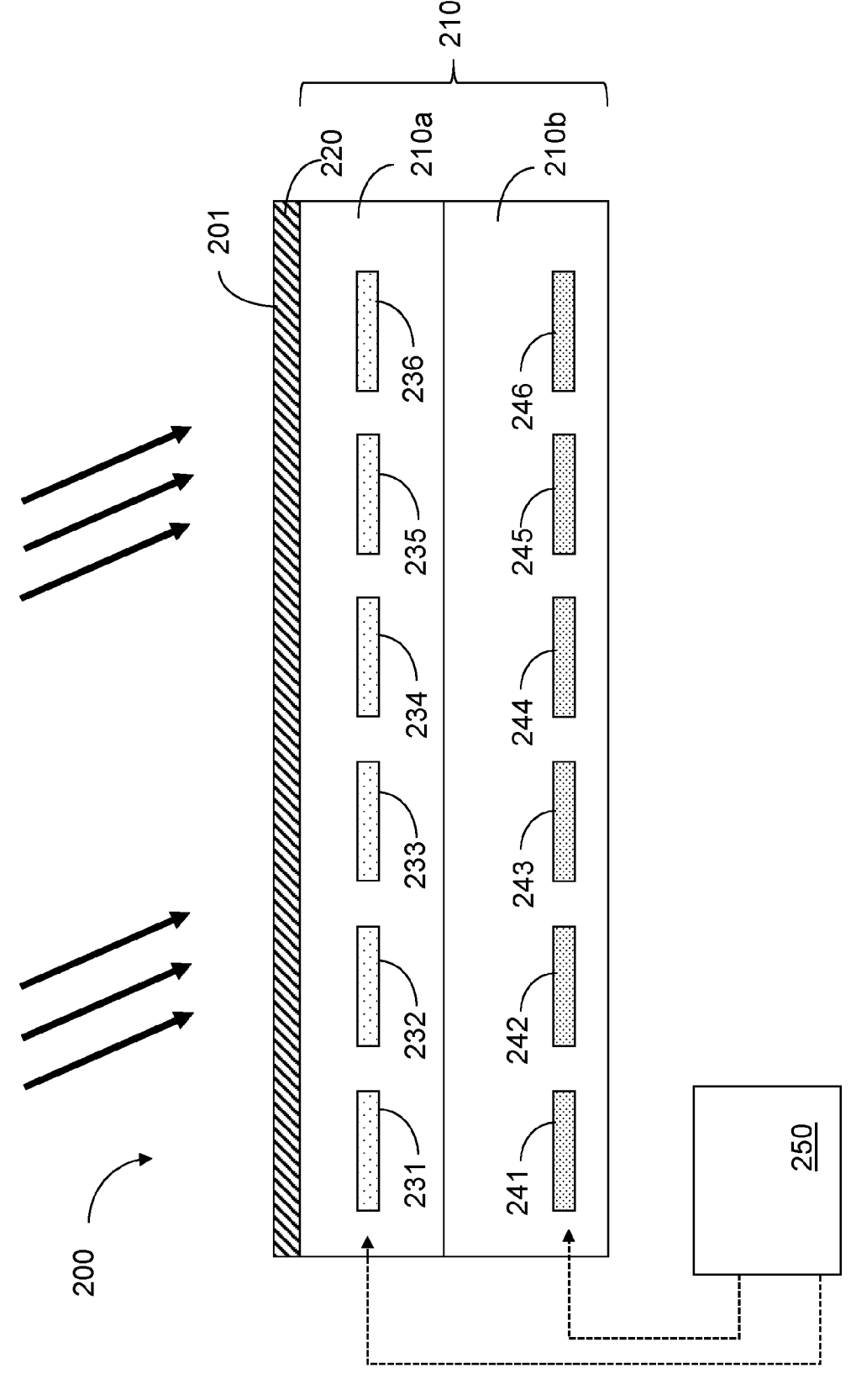
FIGS. 2-6 show schematic illustrations for elucidating the possible structure of a mirror according to other embodiments of the disclosure.

FIG. 2 shows a further embodiment of an adaptive mirror 200, wherein components that are analogous or substantially functionally identical in comparison with FIG. 1 are designated by reference numerals increased by "100". The embodiment of FIG. 2 differs from that of FIG. 1 in that the mirror substrate 210 is composed of different mirror substrate parts 210a, 210b, wherein the mirror substrate part 210a arranged closer to the optically effective surface 201 is produced from a mirror substrate material with a comparatively low average coefficient of thermal expansion. In a specific exemplary embodiment, the mirror substrate material of the first mirror substrate part 210a may be ULE™ and the mirror substrate material of the second mirror substrate part 210b may be quartz glass (SiO₂).

Figure 3:
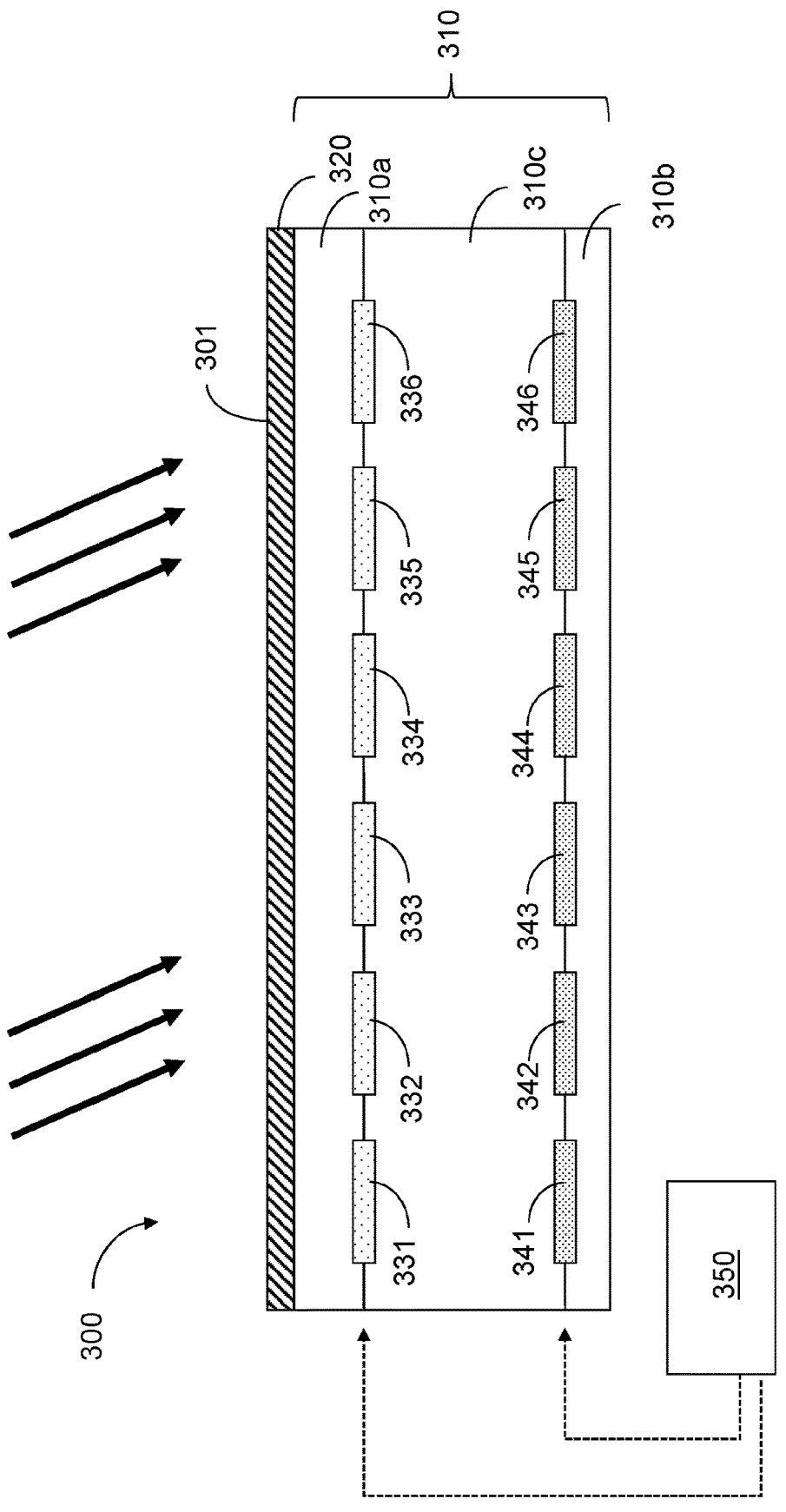

FIG. 3 shows a further embodiment of an adaptive mirror 300 according to the disclosure, wherein, in turn, components that are analogous or substantially functionally identical to FIG. 2 are designated by reference numerals increased by "100". The exemplary embodiment of FIG. 3 differs from that of FIG. 2 in that the mirror substrate 310 is composed of three different mirror substrate parts 310a, 310b and 310c, wherein the respective walls of the cooling channels serving as temperature control zones 331-336, 341-346 have already been introduced into these mirror substrate parts in a manner that is favourable from a manufacturing technology perspective. Specifically, the first mirror substrate part 310a (which in turn can be manufactured from ULE™) serves as top part for the cooling channels that serve as the temperature control zones 331-336, and the second mirror substrate part 310b (which can be manufactured e.g. from quartz glass (SiO₂)) serves as bottom part for the cooling channels that form the temperature control zones 341-346. The third mirror substrate part 310c is arranged between the first mirror substrate part 310a and the second mirror substrate part 310b and serves at the same time as bottom part for the cooling channels that form the temperature control zones 331-336 and as top part for the cooling channels that form the temperature control zones 341-346 and may be manufactured either from ULE™ or from quartz glass (SiO$_2$) depending on the specific conditions.

The use of a material with a comparatively higher coefficient of thermal expansion relative to ULE™ on sides of the mirror substrate part 210b in the embodiment of FIG. 2 or the mirror substrate part 310b or 310c in the embodiment of FIG. 3 is desirable insofar as, in the region of these mirror substrate parts, a greater thermal expansion (relative to the first mirror substrate part 210a and 310a, respectively, that is closer to the optically effective surface) is definitely desired in order to achieve a significant deformation effect in the adaptive mirror according to the disclosure. At the same time, in certain regions the adaptive mirror can be manufactured from a comparatively less expensive material (relative to ULE™) in this way.

Figure 4:
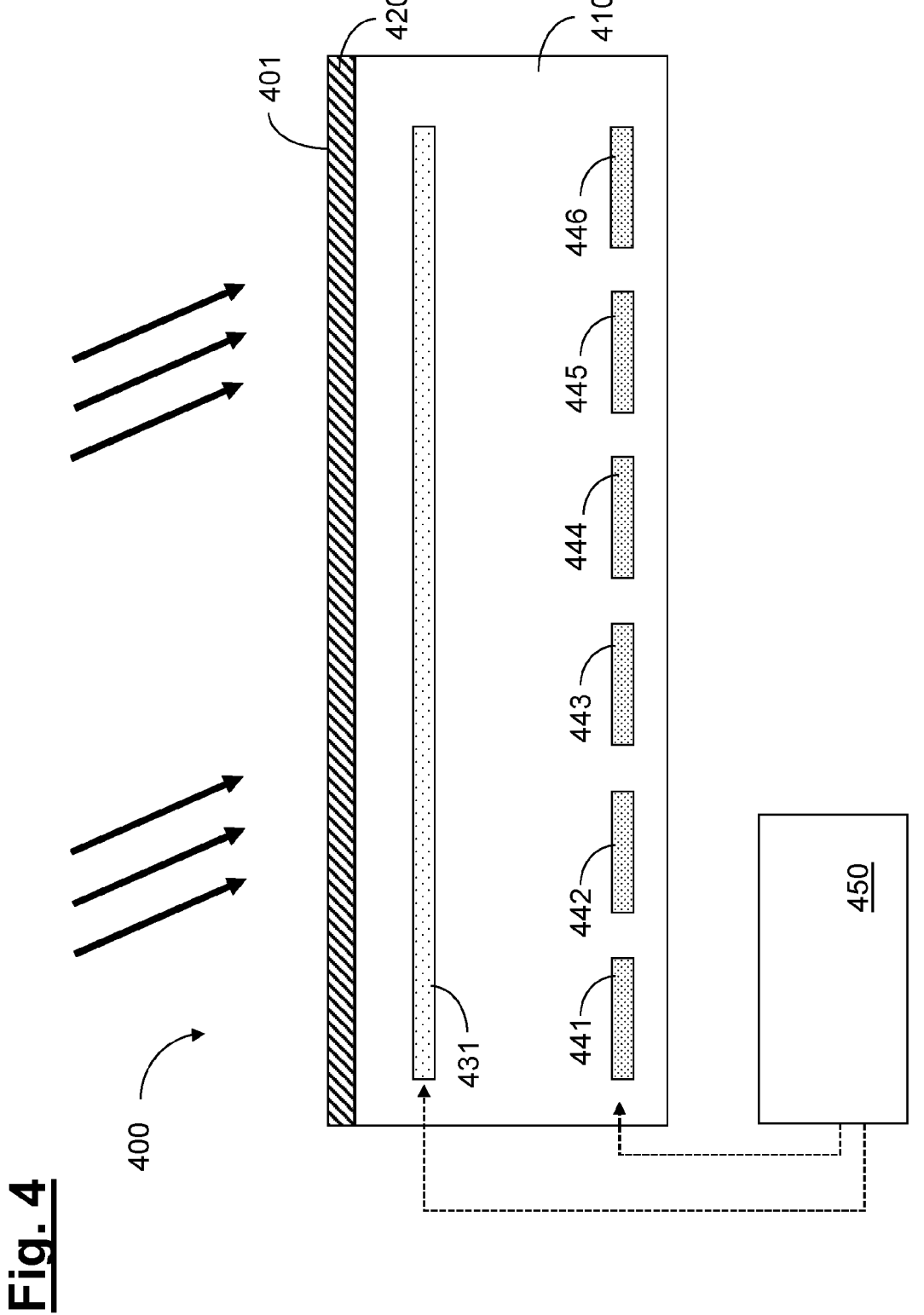

FIG. 4 shows a further embodiment of an adaptive mirror 400, wherein components that are analogous or substantially functionally identical in comparison with FIG. 1 are designated by reference numerals increased by "300". The embodiment of FIG. 4 differs from that of FIG. 1 in that, instead of the temperature control zones 131-136, only a single temperature control zone 431 (which is continuous, or not segmented into multiple individual temperature control zones) is present in the relevant plane within the mirror substrate 410. In the configuration according to FIG. 4, in terms of this non-segmented temperature control zone 431, a spatial resolution, achievable with the segmentation, in a lateral direction is deliberately dispensed with, in order to in return reduce the total number of cooling fluid ports used and thus firstly decrease the structural outlay and secondly also prevent the risk of tightness defects, or leaks, arising in the region of the cooling channels.

Figure 5:
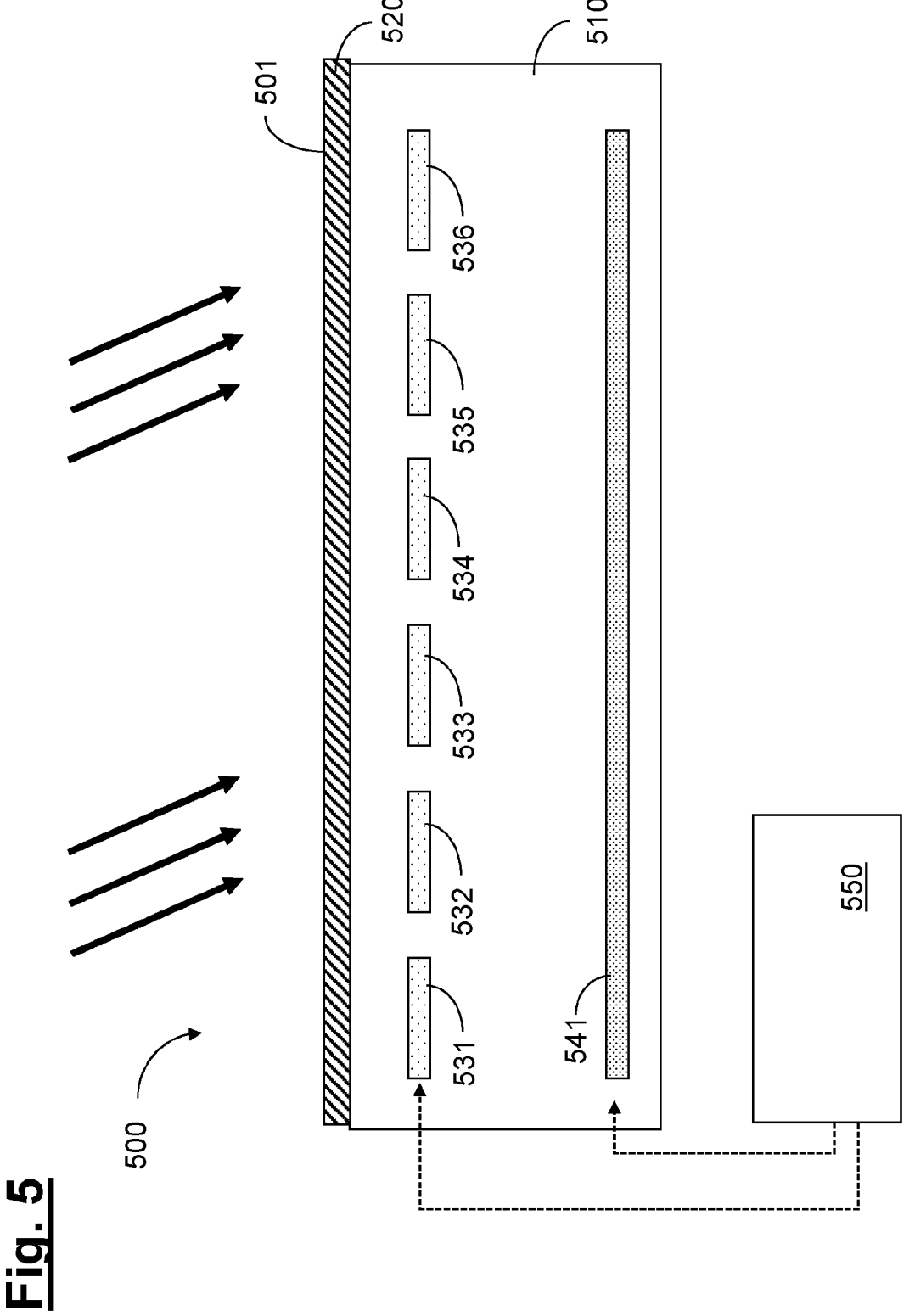

FIG. 5 shows a further embodiment of an adaptive mirror 500, wherein components that are analogous or substantially functionally identical in comparison with FIG. 1 are designated by reference numerals increased by "400". The embodiment of FIG. 5 differs from that of FIG. 1 in that, instead of the temperature control zones 141-146 arranged in the plane at a comparatively great distance from the optically effective surface 101 according to the embodiment of FIG. 1, only a single temperature control zone 541 (which is continuous, or not segmented into multiple individual temperature control zones) is provided. In other words, in the embodiment according to FIG. 5, by contrast to that of FIG. 4, segmentation or lateral spatial resolution is dispensed with not within the plane that is closer to the optically effective surface, but rather for the plane that is at a greater distance from the optically effective surface, or the temperature control zone there. It is also the case in this configuration that reducing the total number of cooling fluid ports has the effect of simplifying the structure from a design perspective and of reducing the risk of leaks.

Figure 6:
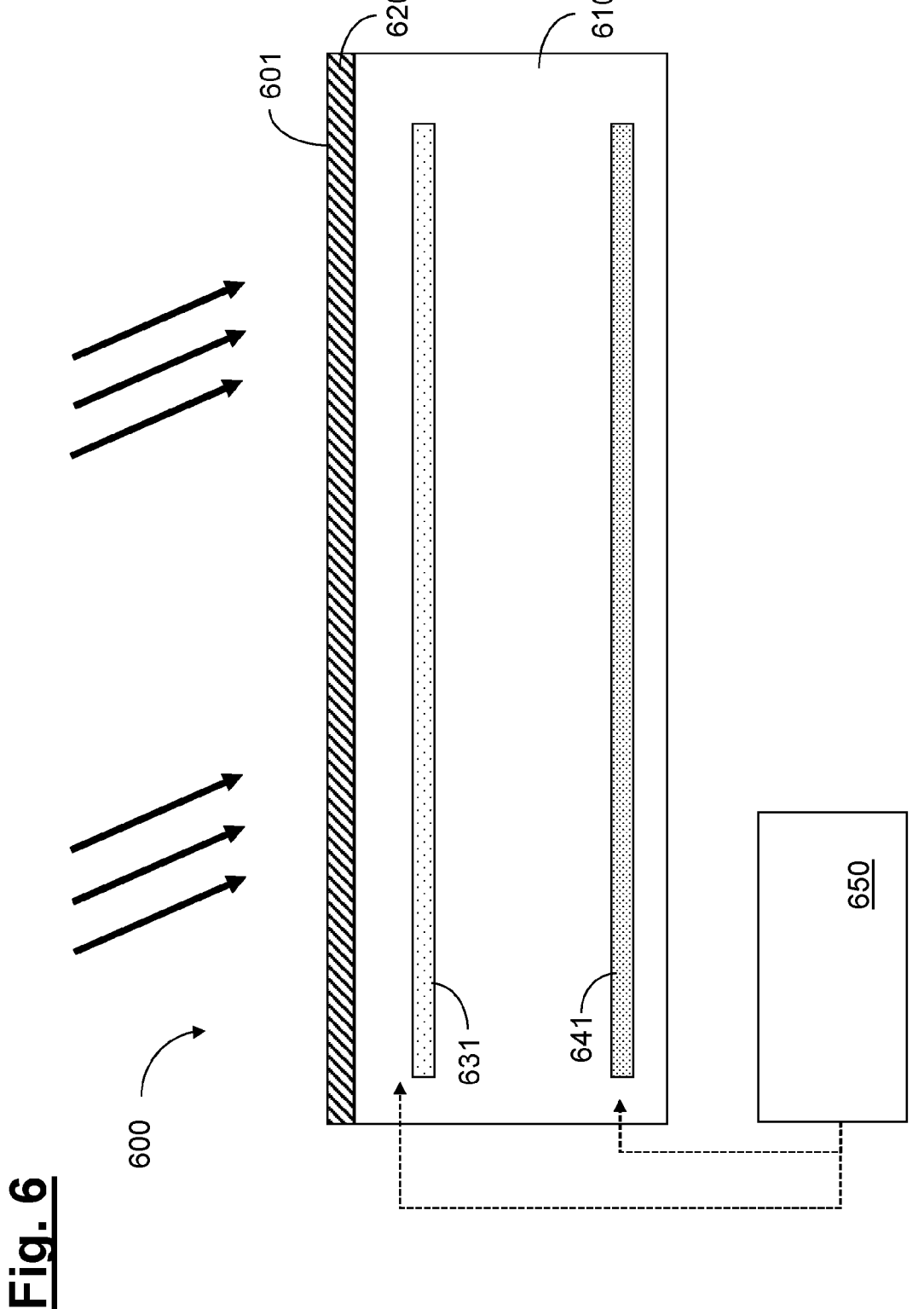

FIG. 6 shows a further embodiment of an adaptive mirror 600, wherein components that are analogous or substantially functionally identical in comparison with FIG. 1 are designated by reference numerals increased by "500". The embodiment of FIG. 6 differs from that of FIG. 1 in that the temperature control zones 131-136 and 141-146 that are in the two planes according to FIG. 1 are each replaced by a single temperature control zone 631 and 641 (which is continuous and not segmented into multiple individual temperature control zones), respectively. In this embodiment, segmentation or lateral resolution in the two planes in the region of the temperature control zones 631, 641 is dispensed with, resulting in the number of cooling fluid ports being minimized.

In all of the embodiments described above, water or any desired other suitable cooling fluid can be used as cooling fluid.

In further embodiments, the concept according to the disclosure of the cooling channels, or temperature control zones, through which, independently of one another, a cooling fluid flows can also be used in combination with local heating of the optically effective surface of the relevant mirror (e.g. by radiant heaters).

In all of the embodiments described above on the basis of FIGS. 1-6, the temperature respectively set in the temperature control zones can be regulated in a temporally variable manner. In this respect, a determination, underlying this regulation, of the current heating state of the respective mirror can for example also be carried out on the basis of an ascertainment of the cooling power that is output when the cooling fluid flows through the cooling channels. To that end, for example, the change in temperature of the cooling fluid flowing through a cooling channel can be measured using temperature sensors at the inlet and outlet, and then, given a known flow rate and a known heat transfer coefficient at the respective cooling channel wall, conclusions can be drawn as to the temperature gradient present in the mirror substrate material.

Even though the disclosure has been described on the basis of specific embodiments, numerous variations and alternative embodiments will be apparent to the person skilled in the art, for example through combination and/or exchange of features of individual embodiments. Accordingly, it goes without saying for a person skilled in the art that such variations and alternative embodiments are also encompassed by the present disclosure, and the scope of the disclosure is restricted only within the meaning of the appended patent claims and the equivalents thereof.

What is claimed is:

1. An optical system, comprising:
   a mirror comprising an optically effective surface and a mirror substrate, the mirror substrate comprising a plurality of temperature control zones;
   a temperature control device configured to set temperatures in the temperature control zones independently of one another; and
   a device,
   wherein:
      the temperature control zones are in two planes at different distances from the optically effective surface;
      the temperature control zones in the two planes comprise cooling channels through which, independently of one another, a cooling fluid with a variably settable cooling fluid temperature is flowable; and
      the device is configured to ascertain a cooling power that is output when the cooling fluid flows through the cooling channels.

2. The optical system of claim 1, further comprising a regulation unit configured to temporally variably regulate the temperatures set in the temperature control zones by the temperature control device.

3. The optical system of claim 2, wherein the regulation unit is configured so that a determination, underlying the regulation, of a current heating state of the mirror is performed based on the cooling power that is output by the cooling fluid when it flows through the cooling channels.

4. The optical system of claim 1, wherein:

the mirror substrate comprises a first mirror substrate part comprising a first mirror substrate material;

the mirror substrate comprises a second mirror substrate part on a side of the first mirror substrate part facing away from the optically effective surface; and the second mirror substrate part comprises a second mirror substrate material different from the first mirror substrate material.

5. The optical system of claim 4, wherein the two planes are assigned to different mirror substrate parts.

6. The optical system of claim 4, wherein the first mirror substrate material has a lower average coefficient of thermal expansion than the second mirror substrate material.

7. The optical system of claim 1, wherein:

a first plurality of temperature control zones are in a first plane of the two planes; and the temperature control zones located in the first plane are settable independently of one another.

8. The optical system of claim 1, wherein the temperature control device comprises a plurality of Peltier elements, and each Peltier element is assigned to a respective temperature control zone.

9. The optical system of claim 1, wherein the temperature control device comprises a plurality of radiant heaters, and each radiant heater is assigned to a respective temperature control zone.

10. The optical system of claim 1, wherein the optically effective surface is configured to reflect electromagnetic radiation at a wavelength of less than 30 nm.

11. The optical system of claim 1, wherein the optical system is a projection lens a microlithographic projection exposure apparatus, or the optical system is an illumination device of a microlithographic projection exposure apparatus.

12. A method, comprising:

providing the optical system of claim 1; and setting the temperatures in the temperature control zones independently of one another so that a deformation, due to different thermal expansion of the temperature control zones belonging to different of the two planes, corresponds to a desired deformation.

13. The method of claim 12, further comprising temporally variably regulating the temperatures respectively set in the temperature control zones.

14. The method of claim 12, further comprising flowing the cooling fluid through the cooling channels while independently variably setting the temperature of the cooling-fluid temperature in the cooling channels.

15. The method of claim 12, further comprising:

flowing the cooling fluid through the cooling channels;

ascertaining a cooling power that is output when the cooling fluid flows through the cooling channels; and performing a determination, underlying the regulation, of a current heating state of the mirror based on the ascertained cooling power.

16. An optical system, comprising:

a mirror comprising an optically effective surface and a mirror substrate, the mirror substrate comprising a plurality of cooling channels therein, the cooling channels configured so that, independently of one another, a cooling fluid with a variable cooling-fluid temperature is flowable therethrough;

a device configured to ascertain a cooling power output when the cooling fluid flows through the cooling channels; and a regulating unit configured to temporally variably regulate temperatures set in the temperature control zones via the temperature control device, wherein a determination, underlying this regulation, of a current heating state of the mirror is performable based on the ascertained cooling power output when the cooling fluid flows through the cooling channels.

17. A method, comprising:

providing the optical system of claim 16; and setting the temperatures in the temperature control zones independently of one another so that a deformation, due to different thermal expansion of the temperature control zones belonging to different of the two planes, corresponds to a desired deformation.

18. A method of operating an optical system, the optical system comprising a mirror, the mirror comprising an optically effective surface and a mirror substrate, the mirror substrate comprising cooling channels therein and through which, independently of one another, a cooling fluid with a variably settable cooling-fluid temperature is flowable, the method comprising:

ascertaining a cooling power that is output when the cooling fluid flows through the cooling channels;

performing a determination of a current heating state of the mirror based on the ascertained cooling power; and using the determined current heating state to regulate the a temperature set in the temperature control zones in a temporally variable manner.

19. The optical system of claim 2, wherein the regulation unit is configured so that a determination, underlying this regulation, of a current heating state of the mirror is performable based on the ascertained cooling power output when the cooling fluid flows through the cooling channels.

20. The optical system of claim 16, wherein:

the mirror substrate comprises a first mirror substrate part comprising a first mirror substrate material;

the mirror substrate comprises a second mirror substrate part on a side of the first mirror substrate part facing away from the optically effective surface; and the second mirror substrate part comprises a second mirror substrate material different from the first mirror substrate material.

* * * * *